United States Patent
Delhougne et al.

(10) Patent No.: US 6,906,400 B2
(45) Date of Patent: Jun. 14, 2005

(54) SIGE STRAIN RELAXED BUFFER FOR HIGH MOBILITY DEVICES AND A METHOD OF FABRICATING IT

(75) Inventors: Romain Delhougne, Igny (FR); Roger Loo, Kessel-Lo (BE); Philippe Meunier-Beillard, Bertem (BE); Mathieu Caymax, Leuven (BE)

(73) Assignees: Interuniversitair Microelektronica Centrum (IMEC), Leuven (BE); Koninklijke Philips Electronics, Eindhoven (NL)

( * ) Notice: Subject to any disclaimer, the term of this patent is extended or adjusted under 35 U.S.C. 154(b) by 0 days.

(21) Appl. No.: 10/756,840

(22) Filed: Jan. 13, 2004

(65) Prior Publication Data

US 2004/0227158 A1 Nov. 18, 2004

Related U.S. Application Data

(60) Provisional application No. 60/440,400, filed on Jan. 14, 2003.

(30) Foreign Application Priority Data

Jan. 14, 2003 (EP) .............................................. 03447007

(51) Int. Cl.⁷ ................... H01L 31/117; H01L 31/0328; H01L 31/0336; H01L 31/072; H01L 31/109
(52) U.S. Cl. .......................... 257/616; 257/19; 257/190
(58) Field of Search ............................. 257/18, 19, 22, 257/77, 190, 616

(56) References Cited

U.S. PATENT DOCUMENTS 6,190,975 B1    2/2001    Kubo et al.

| | | | |
|---|---|---|---|
| 2001/0028067 A1 | | 10/2001 | Awano |
| 2004/0192069 A1 | * | 9/2004 | Bedell et al. ................ 438/778 |
| 2004/0248354 A1 | * | 12/2004 | Chidambaram et al. .... 438/201 |
| 2005/0003229 A1 | * | 1/2005 | Bedell et al. ............... 428/641 |
| 2005/0003599 A1 | * | 1/2005 | Yeo et al. .................... 438/200 |

FOREIGN PATENT DOCUMENTS

| WO | 0201624 | 1/2002 |
|---|---|---|
| WO | 0215244 | 2/2002 |

OTHER PUBLICATIONS

European Search Report dated Oct. 23, 2003 in Equivalent European Application No. 03 44 7007.

Osten, et al., Appl. Phys. Lett., vol. 21, pp. 2813–2815 (May 26, 1997).

Lanzerotti, et al., Electron Devices Meeting, San Francisco, Dec. 8–11, 1996, pp. 249–252, IEEE (Dec. 8, 1996).

Osten, et al., Appl. Phys. Lett., vol. 70, No. 21, pp 3440–3442 (Jun. 20, 1994).

G. A. Shafeev and P. Hoffman, Appl. Surf. Sci. 138–139: 455–460 (1999).

* cited by examiner

Primary Examiner—Ngân V. Ngô
(74) Attorney, Agent, or Firm—Knobbe Martens Olson & Bear LLP

(57) ABSTRACT

A semiconductor device is provided comprising a semiconductor substrate having on its top a Thin Strain Relaxed Buffer. The Thin Strain Relaxed Buffer consists of a stack of three layers of essentially constant Ge concentration. The three layers include a first epitaxial layer of $Si_{1-x}Ge_x$, a second epitaxial layer of $Si_{1-x}Ge_x$:C, and a third epitaxial layer of $Si_{1-x}Ge_x$ on the second epitaxial layer. A method to fabricate such a buffer is also provided.

35 Claims, 2 Drawing Sheets

Strained Silicon — 5-10 nm
Strain Adjusted SiGe — 50-100 nm
— 75 nm
TSRB — 5 nm
— 150 nm
Silicon Substrate

SIGE STRAIN RELAXED BUFFER FOR HIGH MOBILITY DEVICES AND A METHOD OF FABRICATING IT

RELATED APPLICATION

This application claims the benefit of U.S. Provisional Application No. 60/440,400, filed Jan. 14, 2003, the contents of which is hereby incorporated by reference in its entirety.

FIELD OF THE INVENTION

An epitaxial multilayer buffer suitable for the creation of high mobility devices on top of a semiconductor substrate is provided. A method to fabricate such a buffer is also provided.

BACKGROUND OF THE INVENTION

For years, digital electronics has been dominated by $Si/SiO_2$ based technology, because of the low cost of silicon and the properties (structural and electronic) of the $Si/SiO_2$ system. Since new applications are focused on wireless and optical communication, conventional silicon based devices do not offer any more sufficient high frequency and optoelectronic properties. Nowadays, two materials/systems have the functionality required for these new applications: III-V materials (InP, GaAs, and the like) and IV-IV heterostructures (SiGe/Si).

Until now high frequency and optical applications mostly have been outclassed by the III-V materials grown on GaAs wafer, but the lack of natural oxide such as $SiO_2$ and the low level of integration possible on these wafers are major drawbacks.

SiGe/Si heterostructures comprising a strain adjusted SiGe layer and a strained Silicon layer improve the electron transport into the strained silicon channel, thanks to a band offset at the heterointerface between SiGe and Si, which leads to the confinement of the electrons in a quantum well. The modification of the band structure is due to the lattice mismatch between Si and SiGe.

In order to benefit from both the functionality of these new systems and the advantages of silicon technology (low cost, high throughput and capacities), one solution is to integrate III-V compounds or SiGe/Si on Si substrate. The main challenge is then to deposit these materials on a substrate, which has a different lattice parameter. The lattice mismatch between the film and the substrate gives rise to the formation and the propagation of dislocations into the epilayer. Each dislocation in the active part of the epitaxial layer leads to the deterioration of the electronic properties and of the carrier transport due to scattering.

The density of dislocations rising to the top of the epitaxial layer can be as high as $1E11$ cm$^{-2}$ for SiGe and $1E10$ cm$^{-2}$ for GaAs, which is too high for any application. In order to grow high functionality materials it is necessary to keep the dislocation density in the active part of the epitaxial layer as low as possible and preferably below $1E4$ cm$^{-2}$, although this specification is not well established yet.

One solution to grow SiGe and III-V compounds on top of a Si substrate without any defects is to insert a Strain Relaxed SiGe Buffer (SRB) between substrate and heterosystem. The characteristics of SiGe make it a suitable compound for SRB application. Furthermore it is possible on Si substrates to adapt SiGe layer systems with 0 (pure Si) to 4.16% (100% Ge) lattice mismatch, determined by the Ge content in the SRB.

Although rather high electron mobility and low threading dislocation density can be obtained, thick graded buffers still present some major economical and technological drawbacks: growth time, material consumption, too large step height for integration with Si microelectronics. To overcome these problems, many efforts have been carried out on Thin Strain Relaxed Buffer (TSRB).

An epitaxial layer can only relax over a critical thickness by introducing dislocations into the epitaxial layer. This critical thickness is mainly determined by the growth conditions (growth rate, temperature, and the like) and by the defects present in the epilayer and/or at the heterointerface. The TSRB employs defects in order to reduce this critical thickness and to confine the dislocations at the heterointerface.

There are three main methods to do this, namely in situ defect creation, ex situ defect creation and compliant substrate. In the preferred embodiments, the in-situ method is used, in which grown-in point defects can act as nucleation sites for misfit dislocations and significantly reduce the critical thickness. The principle of this method is to grow the defects during the deposition of the SRB.

Several researchers have been working on this type of SRB, by using Molecular Beam Epitaxy (MBE), Ultra High Vacuum Chemical Vapor Deposition (UHV-CVD) or Low-Energy Plasma Enhanced Chemical Vapor Deposition (LEPECVD). These methods lead to a high degree of relaxation for the top layer (>90%) for very low thickness (200 nm), while the dislocations are confined into the low temperature epilayer.

The main drawback of these methods is that they are only applicable for MBE, UHV-CVD, or LEPECVD systems. As in RPCVD systems, the growth rate is strongly linked to the growth temperature; the growth at ultra low temperature would be very slow or even impossible.

PCT International Application WO01/73827 by Matsushita describes how an annealed SiGeC crystal layer, comprising a matrix SiGeC crystal layer relaxed in lattice and almost free from dislocations and SiC microcrystals dispersed in the layer, is formed on a Si substrate by heat-annealing a SiGeC crystal layer-deposited Si substrate. Then, a Si crystal layer is deposited on an annealed SiGeC crystal layer to form a distorted Si crystal layer with a minimum dislocation. The main differences with the solution presented by the preferred embodiments lie in the different principle of threading dislocation reduction used and in the degree of relaxation reached.

Osten et al. ('Relaxed $Si_{1-x}Ge_x/Si_{1-x-y}Ge_xC_y$ buffer structures with low threading dislocation density', Appl. Phys. Lett. 70(21), 26 May 1997, pp. 2813–2815) make strain relaxed buffers by deposition of thick SiGe and SiGeC layers. This method is a modification of the standard thick buffer with step-graded Ge-content. Here, layer relaxation is initiated by the high internal stress. This internal stress is build up by growing above a temperature dependent metastable critical layer thickness. Substitutional carbon is used to match the lattice constant of the $Si_{1-x-y}Ge_xC_y$ with the underlying $Si_{1-z}Ge_z$ layer (x>z) and to avoid threading dislocations reaching the surface, as dislocation glide is retarded in the SiGeC layer. The use of substitutional carbon sets an upper limit to the carbon content. Above this limit, interstitial carbon would be implemented.

Lanzerotti et al. ('Suppression of boron outdiffusion in SiGe HBTs by carbon incorporation', International Electron Devices Meeting (IEDM) 96, 8–11 Dec. 1996, pp. 249–252 (IEEE, New York, 1996)) disclose a HBT device with a base consisting of a SiGe/SiGeC/SiGe layer stack, which consequently should be free of any defects. The Ge is implemented to reduce the transit time from emitter to collector, while substitutional C is used to reduce boron outdiffusion in the base. Because the total layer stack has to be defect free, substitutional carbon is required, which set an upper limit to the carbon concentration. The Si cap layer is fully relaxed, because it was grown on strained SiGe. This layer stack is certainly not used as SRB. SRB's allow depositing a strained Si layer with a Ge rich strained SiGe or a III/IV layer on top of it. This is implemented in lateral devices to enhance carrier mobility. Defects are inherent to the SRB fabrication process. The SRB may not be part of the active device area. In this paper the total thickness of the SiGe/SiGeC/SiGe layer stack should stay below the critical thickness for layer relaxation. In contradiction, SRB layers have to be thick enough to enable relaxation.

SUMMARY OF THE INVENTION

The preferred embodiments provide a SiGe strain relaxed buffer (TSRB) with improved features for high mobility devices and to provide a simple, reliable method to grow a TSRB on a semiconductor substrate.

In a first embodiment, a semiconductor device is provided, the semiconductor device comprising a semiconductor substrate, wherein the semiconductor substrate has on its top at least a Thin Strain Relaxed Buffer consisting essentially of a stack of three layers, wherein the Thin Strain Relaxed Buffer is not an active part of the semiconductor device, and wherein the three layers have a substantially constant Ge concentration, the three layers comprising: a first epitaxial layer of $Si_{1-x}Ge_x$, wherein x is a Ge concentration; a second epitaxial layer of $Si_{1-x}Ge_x$:C on the first epitaxial layer, wherein a C concentration in the second epitaxial layer is greater than or equal to about 0.3%; and a third epitaxial layer of $Si_{1-x}Ge_x$ on the second epitaxial layer.

In an aspect of the first embodiment, the semiconductor substrate comprises silicon.

In an aspect of the first embodiment, a thickness of the second epitaxial layer is from about 1 nm to about 20 nm.

In an aspect of the first embodiment, a thickness of the second epitaxial layer is from about 1 nm to about 10 nm.

In an aspect of the first embodiment, a thickness of the second epitaxial layer is about 5 nm.

In an aspect of the first embodiment, the Ge concentration is from about 5% to about 100%.

In an aspect of the first embodiment, the Ge concentration is from about 10% to about 65%.

In an aspect of the first embodiment, the C concentration is from about 0.5% to about 1%.

In an aspect of the first embodiment, the C concentration is about 0.8%.

In an aspect of the first embodiment, the device further comprises a SiGe/Si heterostructure at the top of the Thin Strain Relaxed Buffer, the heterostructure comprising a strain adjusted SiGe layer and a strained Silicon layer.

In an aspect of the first embodiment, the device further comprises a III-V compound at its top.

In an aspect of the first embodiment, the device further comprises an additional epitaxial $Si_{1-x}Ge_x$:C layer underneath the first epitaxial SiGe layer.

In an aspect of the first embodiment, the device further comprises an additional epitaxial $Si_{1-x}Ge_x$ underneath the additional epitaxial $Si_{1-x}Ge_x$:C layer.

In a second embodiment, a method for growing a Thin Strain Relaxed Buffer is provided, the method comprising: providing a semiconductor substrate; depositing a first SiGe epitaxial layer on at least a part of the semiconductor substrate such that the Ge concentration is substantially constant throughout the first epitaxial layer; depositing a second SiGe:C layer on top of the first SiGe epitaxial layer by growing SiGe comprising at least 0.3% carbon such that the Ge concentration is substantially constant throughout the SiGe:C layer and substantially the same as in the first layer; and depositing a second SiGe epitaxial layer on top of the SiGe:C layer, wherein the Ge concentration is substantially constant throughout the third layer.

In an aspect of the second embodiment, the semiconductor substrate comprises silicon.

In an aspect of the second embodiment, the Ge concentration is from about 5% to about 100%.

In an aspect of the second embodiment, the Ge concentration is from about 10% to about 65%.

In an aspect of the second embodiment, the carbon concentration is from about 0.5% to about 1%.

In an aspect of the second embodiment, the carbon concentration is about 0.8%.

In an aspect of the second embodiment, the method further comprises providing a first precursor gas and a second precursor gas, wherein the first precursor gas comprises a Si containing compound or a compound of formula $SiH_zCl_w$, wherein z and w are independently from 1 to 4, wherein the second precursor gas comprises a Ge bearing precursor compound, wherein the layers are deposited making use of the first precursor gas and the second precursor gas.

In an aspect of the second embodiment, the method further comprises providing a carbon containing gas, wherein the carbon containing gas comprises a C bearing compound.

In an aspect of the second embodiment, the method further comprises depositing an additional epitaxial $Si_{1-x}Ge_x$:C layer underneath the first epitaxial SiGe layer on at least a part of the semiconducting substrate.

In an aspect of the second embodiment, the method further comprises depositing an additional epitaxial $Si_{1-x}Ge_x$ layer underneath the additional epitaxial $Si_{1-x}Ge_x$:C layer on at least a part of the semiconducting substrate.

In an aspect of the second embodiment, the method further comprises depositing an additional silicon cap layer on top of the third epitaxial layer.

In an aspect of the second embodiment, the method further comprises exposing a structure comprising the semiconductor substrate and the three epitaxial layers to a temperature of 800° C. or higher, whereby a maximum temperature is defined by a melting point of the SiGe layer. The In an aspect of the second embodiment, the structure further comprises at least one of the additional layers.

In an aspect of the second embodiment, the method further comprises depositing a strain adjusted SiGe layer on top of a Thin Strain Relaxed Buffer.

In an aspect of the second embodiment, the method further comprises depositing a strained silicon layer on top of the strain adjusted SiGe layer.

In an aspect of the second embodiment, depositing the three epitaxial layers and exposing to a temperature of 800° C. or higher are performed without exposure to an oxidizing atmosphere in between depositing and exposing.

In an aspect of the second embodiment, depositing the three epitaxial layers and depositing the additional silicon cap layer are performed without exposure to an oxidizing atmosphere in between depositing.

In an aspect of the second embodiment, the method further comprises depositing an additional silicon cap layer on top of the third epitaxial layer, wherein exposing and depositing are performed without exposure to an oxidizing atmosphere in between.

The method according to claim 13, wherein the method is performed without exposure to an oxidizing atmosphere between depositing layers.

In an aspect of the second embodiment, the method is performed in a same tool without exposure to an oxidizing atmosphere in between depositing layers.

In an aspect of the second embodiment, the substrate is a blanket wafer.

In an aspect of the second embodiment, the substrate is a patterned wafer.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The preferred embodiments relate to a Thin Strain Relaxed Buffer (TSRB) for the integration of high mobility devices (for example SiGe/strained Si system) on top of a semiconductor substrate like e.g. Silicon. In the following description both the Thin Strain Relaxed Buffer and the method to obtain it are explained.

One grows epitaxially a TSRB based on $Si_{0.78}Ge_{0.22}/Si_{0.78}Ge_{0.22}:C_y/Si_{0.78}Ge_{0.22}$ multilayer system, with y (C concentration) at least 0.3% and preferably between 0.5% and 1%. 91% relaxation was reached after rapid thermal annealing (30" at 1000° C.) of the TSRB, with a very smooth surface (RMS~1 nm). No dislocations are observed reaching the surface of the epitaxial layer. Carbon is incorporated during the growth of SiGe with the in-situ method, in order to create heterogeneous centers for dislocation nucleation.

Figure 1:
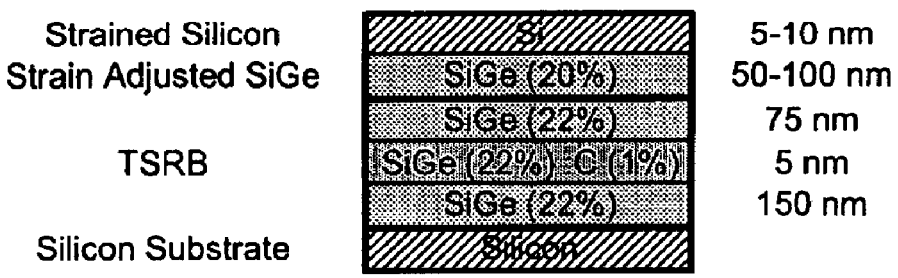
FIG. 1 represents a scheme of the system, containing the TSRB SiGe epitaxial layer.

In FIG. 1 is represented a complete structure of a 230 nm TSRB according to the preferred embodiments on a silicon substrate with a SiGe/Si hetero-system deposited at its top. Although the TSRB is suitable for the adjustment at its top of both a SiGe/Si heterostructure and III-V compounds, the focus in this description is on the SiGe/Si integration on the TSRB. The SiGe/Si hetero-system constitutes the active part of the device. The TSRB is not used as an active part of the device. The charge transport in the active layer occurs in parallel to the TSRB.

Before growing the Thin Strain Relaxed Buffer a native oxide layer is removed from the substrate. The TSRB in FIG. 1 consists of a first epitaxial layer $Si_{0.78}Ge_{0.22}$, a second epitaxial layer $Si_{0.78}Ge_{0.22}:C_y$ and a third epitaxial layer $Si_{0.78}Ge_{0.22}$. The thickness of said second $Si_{0.78}Ge_{0.22}$ layer is between 1 and 20 nm, 5 nm being a preferred value. In all three layers the Ge concentration has an essentially constant value: a constant Ge concentration should be understood as also allowing small deviations from said constant value in the Ge profile. In the example of FIG. 1 a Ge concentration of 22% is used. The Ge concentration can in principle have any value in the range from 5 to 100%, assuming the growth conditions are such that 3-dimensional grow can be avoided. However, the higher the Ge concentration the more difficult to keep advantageous growth conditions.

For the epitaxial deposition of the TSRB several methods can be envisaged. One can use e.g. an Epsilon-One Atmospheric Pressure/Reduced Pressure Chemical Vapor Deposition (AP/RPCVD) epitaxial reactor. This is a single wafer (allowed wafer size: 4" to 12"), horizontal and load locked reactor, with a lamp heated graphite susceptor in a rectangular quartz tube. A first precursor gas, containing Si, and a second precursor gas containing Ge, can be used for the deposition of the epitaxial layers. Further a carrier gas (e.g. $H_2$) can possibly be employed. The first precursor gas can in fact be any Si containing compound, such as, but not limited to, silane, disilane or higher silanes, or any compound from the $SiH_zCl_w$ group with z and w equal to 1–4. The second precursor gas can be any Ge bearing precursor compound such as but not limited to $GeH_4$, $GeCl_4$, or any other Ge containing compound. The following procedure can be used for the growth of the TSRB: loading of the wafer from the load lock to the growth chamber; removing any native silicon oxide or traces of oxide by any means such as dissolution of the oxide in aqueous HF solutions, if needed followed by in-situ baking in an epitaxy tool according to a standard procedure; deposition of the epitaxial layers at about 600° C. for SiGe and SiGe:C, and at about 650° C. for Si. In order to add the carbon, a carbon containing gas can be provided. This can be any C bearing compound such as, but not limited to, $SiH_z(CH_3)_w$ with z and w equal to 1–4. At least 0.3% carbon is to be incorporated, preferably between 0.5 and 1%.

The TSRB can be grown by AP/RP CVD as explained in this text, but any other means of depositing epitaxial Si containing layers are suitable, such as e.g. Molecular Beam Epitaxy, Low Pressure CVD (LPCVD), plasma enhanced CVD, optically enhanced CVD, and so on, as long as they are able to deposit layer structures as specified in the preferred embodiments.

In an alternative embodiment there can be an additional epitaxial $Si_{1-x}Ge_x:C$ layer deposited underneath the first epitaxial SiGe layer on at least a part of the semiconducting substrate. Advantageously there is an additional epitaxial $Si_{1-x}Ge_x$ layer underneath that additional $Si_{1-x}Ge_x:C$ layer on at least a part of the semiconducting substrate.

In a following step the TSRB is exposed to a high temperature in the range from 800° C. up to the melting temperature, which depends on the Ge concentration. For pure Si the melting temperature is 1410° C. and for $Si_{1-x}Ge_x$ 937° C. for pure Ge. A method like e.g. a rapid thermal annealing procedure can be applied. For the rapid thermal annealing of the TSRB a 50° C./sec ramped temperature profile is chosen with an intermediate step of 5s at 700° C. The samples are annealed for 30 seconds at 1000° C., with Nitrogen as carrier gas. The samples are cooled down for 20 minutes into the furnace in order to avoid oxidation of the surface of the sample. A second method is used in the Epsilon-One epitaxial reactor where the samples are annealed for 30 seconds at 1050° C. with a ramped temperature profile of 10 to 15° C./sec and hydrogen as carrier gas.

For the deposition of the strain adjusted $Si_{1-x}Ge_x$ layer on the TSRB, the TSRB is first cleaned, followed by a 30" etching procedure into HF (2%). The TSRB then is placed into the epsilon load lock for 1 hour of nitrogen purge. Before deposition, there is a 3 minute bake at 850° C. Other procedures can be followed to obtain the same result.

Figure 2:
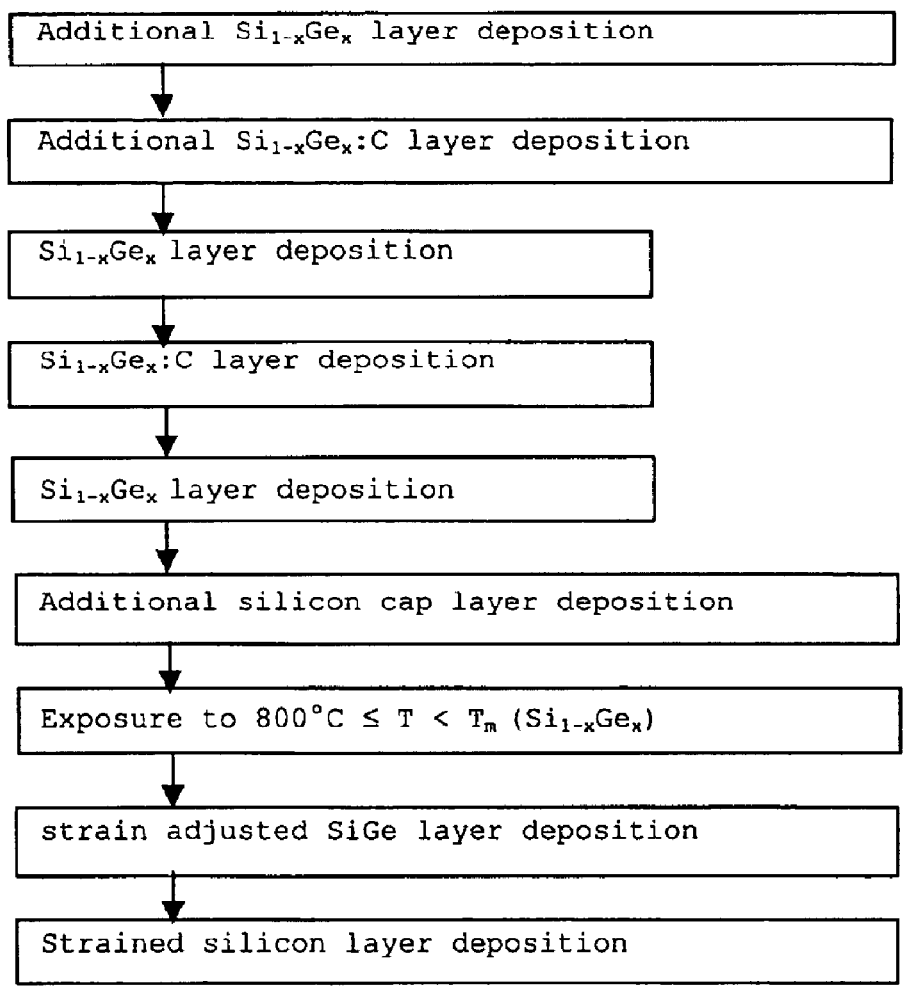
FIG. 2 represents a flow chart with the steps of the method of the preferred embodiments.

All steps of the method of the preferred embodiments are summarized in the flow chart of FIG. 2.

The surface of the layers is checked by means of a Nomarsky interference microscope. Ellipsometric spectroscopy is used to determine the Ge content and the thickness of the layers, by using ASET-F5 tool (Advanced Spectroscopic Ellipsometry Technology) from KLA-TENCOR. The IR absorption spectra is measured by a Fourier Transform Infra Red absorption tool. The surface Root Mean Square roughness is checked by AFM (tapping mode). In order to avoid excessive long time of measurements, a light scattering tool (SP1/KLA TENCOR) is used to measure the low frequency component of the output signal.

Figure 3:
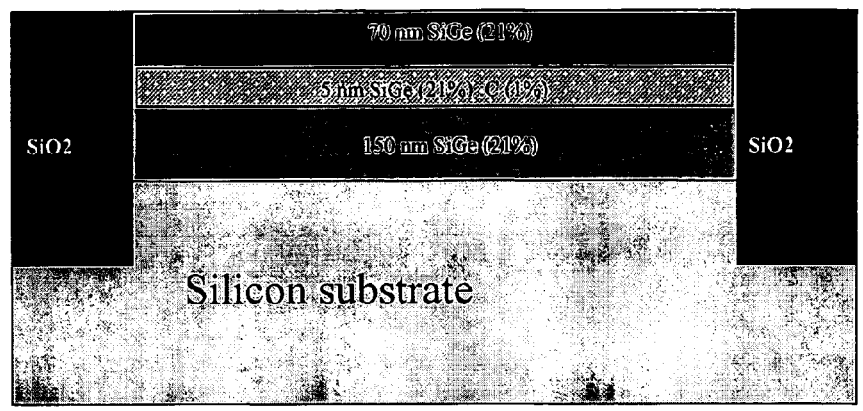
FIG. 3 represents the TSRB structure in case of selective growth.

In the previous, blanket wafers were considered, i.e. without patterns at the surface of the silicon wafers. The described method can however be modified for the growth of TSRB on patterned wafers. Latter wafers present both silicon and Shallow Trench Insulator (STI) trenches filled with $SiO_2$. These STI structures are used as electrical insulators between the transistors. FIG. 3 shows the final structure of the selective TSRB. Also other isolation structures such as LOCOS or others can be present.

The aim of the selective epitaxial deposition of the TSRB is to avoid any problems due to the formation of STI trenches into the $Si_{1-x}Ge_x$ buffer (and Strained silicon). Because of the thermal instability of strained silicon, and the chemical reactivity of SiGe, which is different from silicon, this module contains some critical steps, such as the oxidation of SiGe/Si and resist strip after trench formation. Thanks to the selective growth of the TSRB and the Strained Silicon, the STI module keeps standard steps and therefore the integration of the TSRB/Strained Si system becomes much easier than in case of a conventional non-selective growth.

The system used for the deposition is the same as the one used for the non-selective growth.

The process is the following: a) removing any native silicon oxide or traces of oxide by any means such as dissolution of the oxide in aqueous HF solutions, if needed followed by in-situ baking in an epitaxy tool according to a standard procedure; and b) the TSRB is then grown at 650° C. using DichloroSilane (DCS), Germane en MonoMethyl-Silane (MMS) as precursor gases. By using HCl during the deposition it is then possible to grow selectively (i.e. only on the silicon) the TSRB. Also other Si, C and Ge precursor gases could be used as long as the deposition remains selective.

So, it is possible to deposit selectively the TSRB on a patterned wafer (with oxide structures) with the same characteristics: high relaxation, smooth, and no threading dislocations reaching the surface of the TSRB.

By using the selective growth of TSRB, the TSRB+ Strained Silicon is deposited after the STI formation and therefore the STI module is kept unchanged (standard CMOS). The integration of the TSRB into standard CMOS process flow is therefore much easier. One can therefore skip the critical steps in the STI module which are the oxidation of TSRB/Strained Si and the resist strip after the etching of the STI trenches.

Figure 4:
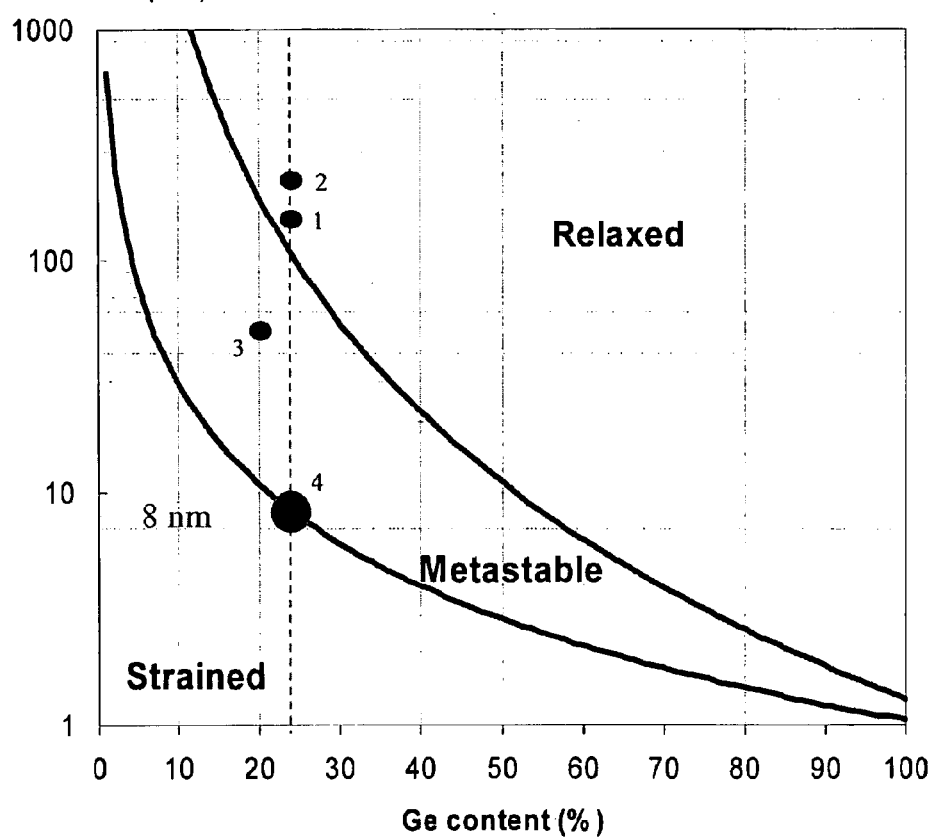
FIG. 4 represents the critical thickness vs. Ge concentration according to prior art solutions and the method of the preferred embodiments.

FIG. 4 finally shows a graph of the critical thickness versus the Ge concentration. Underneath the bottom line, the energetically preferred condition is strained SiGe. For layers above this bottom line, the energetically preferred condition is relaxed SiGe. In case of dislocations, a metastable area is caused by the fact that a certain activation energy has to be overcome. The top line of the graph is also function of growth temperature (higher temp->critical thicknesses decrease) and layer quality (more defects->faster relaxation). This last effect is influenced by creating in-grown point defects due to carbon incorporation. Point 1 indicates the thickness of the bottom SiGe layer, point 2 that of the total SRB stack, point 3 represents the layer thickness as in the Lanzerotti paper. Point 4 gives the theoretical critical thickness (below the curve:stable area, strained SiGe).

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. All patents, applications, and other references cited herein are hereby incorporated by reference in their entirety.

What is claimed is:

1. A semiconductor device, the semiconductor device comprising a semiconductor substrate, wherein the semiconductor substrate has on its top at least a Thin Strain Relaxed Buffer consisting essentially of a stack of three layers, wherein the Thin Strain Relaxed Buffer is not an active part of the semiconductor device, and wherein the three layers have a substantially constant Ge concentration, the three layers comprising:
    a first epitaxial layer of $Si_{1-x}Ge_x$, wherein x is the Ge concentration;
    a second epitaxial layer of $Si_{1-x}Ge_x$:C on the first epitaxial layer, wherein a C concentration in the second epitaxial layer is greater than or equal to about 0.3%; and
    a third epitaxial layer of $Si_{1-x}Ge_x$ on the second epitaxial layer.

2. The semiconductor device of claim 1, wherein the semiconductor substrate comprises silicon.

3. The semiconductor device of claim 1, wherein a thickness of the second epitaxial layer is from about 1 nm to about 20 nm.

4. The semiconductor device of claim 1, wherein a thickness of the second epitaxial layer is from about 1 nm to about 10 nm.

5. The semiconductor device of claim 1, wherein a thickness of the second epitaxial layer is about 5 nm.

6. The semiconductor device of claim 1, wherein the Ge concentration is from about 5% to about 100%.

7. The semiconductor device of claim 1, wherein the Ge concentration is from about 10% to about 65%.

8. The semiconductor device of claim 1, wherein the C concentration is from about 0.5% to about 1%.

9. The semiconductor device of claim 1, wherein the C concentration is about 0.8%.

10. The semiconductor device of claim 1, further comprising a SiGe/Si heterostructure at the top of the Thin Strain Relaxed Buffer, the heterostructure comprising a strain adjusted SiGe layer and a strained Silicon layer.

11. The semiconductor device of claim 1, further comprising a III-V compound at its top.

12. The semiconductor device of claim 1, further comprising an additional epitaxial $Si_{1-x}Ge_x$:C layer underneath the first epitaxial SiGe layer.

13. The semiconductor device of claim 12, further comprising an additional epitaxial $Si_{1-x}Ge_x$ underneath the additional epitaxial $Si_{1-x}Ge_x$:C layer.

14. A method for growing a Thin Strain Relaxed Buffer, the method comprising:

providing a semiconductor substrate;

depositing a first SiGe epitaxial layer on at least a part of the semiconductor substrate such that the Ge concentration is substantially constant throughout the first epitaxial layer;

depositing a second SiGe:C layer on top of the first SiGe epitaxial layer by growing SiGe comprising at least 0.3% carbon such that the Ge concentration is substantially constant throughout the SiGe:C layer and substantially the same as in the first layer; and depositing a second SiGe epitaxial layer on top of the SiGe:C layer, wherein the Ge concentration is substantially constant throughout the third layer.

15. The method according to claim 14, wherein the semiconductor substrate comprises silicon.

16. The method according to claim 14, wherein the Ge concentration is from about 5% to about 100%.

17. The method according to claim 14, wherein the Ge concentration is from about 10% to about 65%.

18. The method according to claim 14, wherein the C concentration is from about 0.5% to about 1%.

19. The method according to claim 14, wherein the C concentration is about 0.8%.

20. The method according to claim 14, further comprising:

providing a first precursor gas and a second precursor gas, wherein the first precursor gas comprises a Si containing compound or a compound of formula $SiH_zCl_w$, wherein z and w are independently from 1 to 4, wherein the second precursor gas comprises a Ge bearing precursor compound, wherein the layers are deposited making use of the first precursor gas and the second precursor gas.

21. The method according to claim 14, further comprising:

providing a carbon containing gas, wherein the carbon containing gas comprises a C bearing compound.

22. The method according to claim 14, further comprising:

depositing an additional epitaxial $Si_{1-x}Ge_x$:C layer underneath the first epitaxial SiGe layer on at least a part of the semiconducting substrate.

23. The method according to claim 22, further comprising:

depositing an additional epitaxial $Si_{1-x}Ge_x$ layer underneath the additional epitaxial $Si_{1-x}Ge_x$:C layer on at least a part of the semiconducting substrate.

24. The method according to claim 14, further comprising:

depositing an additional silicon cap layer on top of the third epitaxial layer.

25. The method according to claim 14, further comprising:

exposing a structure comprising the semiconductor substrate and the three epitaxial layers to a temperature of 800° C. or higher, whereby a maximum temperature is defined by a melting point of the SiGe layer.

26. The method according to claim 25, wherein the structure further comprises at least one of the additional layers.

27. The method according to claim 14, further comprising:

depositing a strain adjusted SiGe layer on top of a Thin Strain Relaxed Buffer.

28. The method according to claim 27, further comprising:

depositing a strained silicon layer on top of the strain adjusted SiGe layer.

29. The method according to claim 25, wherein depositing the three epitaxial layers and exposing to a temperature of 800° C. or higher are performed without exposure to an oxidizing atmosphere in between depositing and exposing.

30. The method according to claim 24, wherein depositing the three epitaxial layers and depositing the additional silicon cap layer are performed without exposure to an oxidizing atmosphere in between depositing.

31. The method according to claim 25, further comprising depositing an additional silicon cap layer on top of the third epitaxial layer, wherein exposing and depositing are performed without exposure to an oxidizing atmosphere in between.

32. The method according to claim 14, wherein the method is performed without exposure to an oxidizing atmosphere between depositing layers.

33. The method according to claim 14, wherein the method is performed in a same tool without exposure to an oxidizing atmosphere in between depositing layers.

34. The method according to claim 14, wherein the substrate is a blanket wafer.

35. The method according to claim 14, wherein the substrate is a patterned wafer.

* * * * *